United States Patent
Thallner et al.

(10) Patent No.: US 9,378,996 B2
(45) Date of Patent: Jun. 28, 2016

(54) HOLDING DEVICE FOR HOLDING A PATTERNED WAFER

(75) Inventors: Werner Thallner, St. Florian (AT); Daniel Burgstaller, Neuhofen/Innkreis (AT)

(73) Assignee: EV Group W. Thallner GmbH, St. Forian am Inn (AT)

( * ) Notice: Subject to any disclaimer, the term of this patent is extended or adjusted under 35 U.S.C. 154(b) by 109 days.

(21) Appl. No.: 14/236,942

(22) PCT Filed: Aug. 12, 2011

(86) PCT No.: PCT/EP2011/063963
§ 371 (c)(1),
(2), (4) Date: Feb. 4, 2014

(87) PCT Pub. No.: WO2013/023680
PCT Pub. Date: Feb. 21, 2013

(65) Prior Publication Data
US 2014/0159321 A1    Jun. 12, 2014

(51) Int. Cl.
*H01L 21/68* (2006.01)
*H01L 21/683* (2006.01)
*H01L 21/687* (2006.01)
*B25B 11/00* (2006.01)

(52) U.S. Cl.
CPC ...... *H01L 21/6838* (2013.01); *H01L 21/68757* (2013.01); *B25B 11/005* (2013.01); *B25B 11/007* (2013.01); *Y10T 29/49998* (2015.01); *Y10T 29/53191* (2015.01); *Y10T 29/53265* (2015.01); *Y10T 279/11* (2015.01)

(58) Field of Classification Search
CPC ............... B25B 11/005; B25B 11/007; Y10T 29/49998; Y10T 29/53191; Y10T 29/53265; Y10T 29/53961; Y10T 29/53991; Y10T 279/11; H01L 21/6838; H01L 21/68757
See application file for complete search history.

(56) References Cited

U.S. PATENT DOCUMENTS

| | | | | |
|---|---|---|---|---|
| 2,366,935 A | * | 1/1945 | Schmid | B23B 31/307 101/407.1 |
| 4,904,012 A | * | 2/1990 | Nishiguchi | H01L 21/6838 29/743 |
| 4,906,011 A | * | 3/1990 | Hiyamizu | B25B 11/005 269/21 |
| 5,516,125 A | * | 5/1996 | McKenna | B25B 11/007 228/44.7 |

(Continued)

FOREIGN PATENT DOCUMENTS

| | | | | |
|---|---|---|---|---|
| EP | 0488722 | 6/1992 | | H01L 21/00 |
| JP | 61-249238 | 11/1986 | | B23Q 3/08 |

(Continued)

OTHER PUBLICATIONS

International Search Report for Int'l Application No. PCT/EP2011/063963 Nov. 11, 2011—3 pages (English only).

(Continued)

*Primary Examiner* — Jason L Vaughan
(74) *Attorney, Agent, or Firm* — Kusner & Jaffe

(57) ABSTRACT

This invention relates to a mounting apparatus for mounting and supporting one structure side of a substrate, which structure side has structures thereon. The apparatus having a mounting element with a flat mounting surface for supporting the structures and a suction surface $F_2$ which penetrates the mounting surface solely in an outer ring surface for effecting a fluid flow which produces suctions on the substrate.

11 Claims, 3 Drawing Sheets

(56) References Cited

U.S. PATENT DOCUMENTS

| | | | | |
|---|---|---|---|---|
| 6,164,633 | A * | 12/2000 | Mulligan | B25B 11/005 269/21 |
| 6,217,034 | B1 * | 4/2001 | Smedt | B25B 5/06 118/503 |
| 7,021,635 | B2 * | 4/2006 | Sheydayi | H01L 21/6838 269/21 |
| 7,488,145 | B2 * | 2/2009 | Watanabe | B28D 1/041 279/3 |
| 2002/0166625 | A1 | 11/2002 | Ball et al. | 156/247 |
| 2003/0220059 | A1 * | 11/2003 | Yamasaki | B25B 11/005 451/388 |
| 2005/0036267 | A1 | 2/2005 | Savas et al. | 361/234 |
| 2007/0152690 | A1 | 7/2007 | Sung | 324/761 |
| 2008/0146124 | A1 | 6/2008 | Morita | 451/289 |
| 2008/0276864 | A1 | 11/2008 | Koelmel et al. | 118/500 |
| 2009/0269490 | A1 | 10/2009 | Moriyama et al. | 427/240 |

FOREIGN PATENT DOCUMENTS

| | | | |
|---|---|---|---|
| JP | 2003-203964 | 7/2003 | H01L 21/68 |
| JP | 2004-153270 | 5/2004 | H01L 21/301 |
| JP | 2004-273714 | 9/2004 | B65G 49/06 |
| JP | 2005/116842 | 4/2005 | H01L 21/68 |
| JP | 2008-147591 | 6/2008 | H01L 21/304 |
| JP | 2009-274169 | 11/2009 | B24B 37/30 |

OTHER PUBLICATIONS

Office Action received in corresponding European Patent Application No. 11743548.7, dated Nov. 24, 2015.

Office Action issued in corresponding Japanese Patent Application No. 2014-525325 dated Mar. 22, 2016.

* cited by examiner

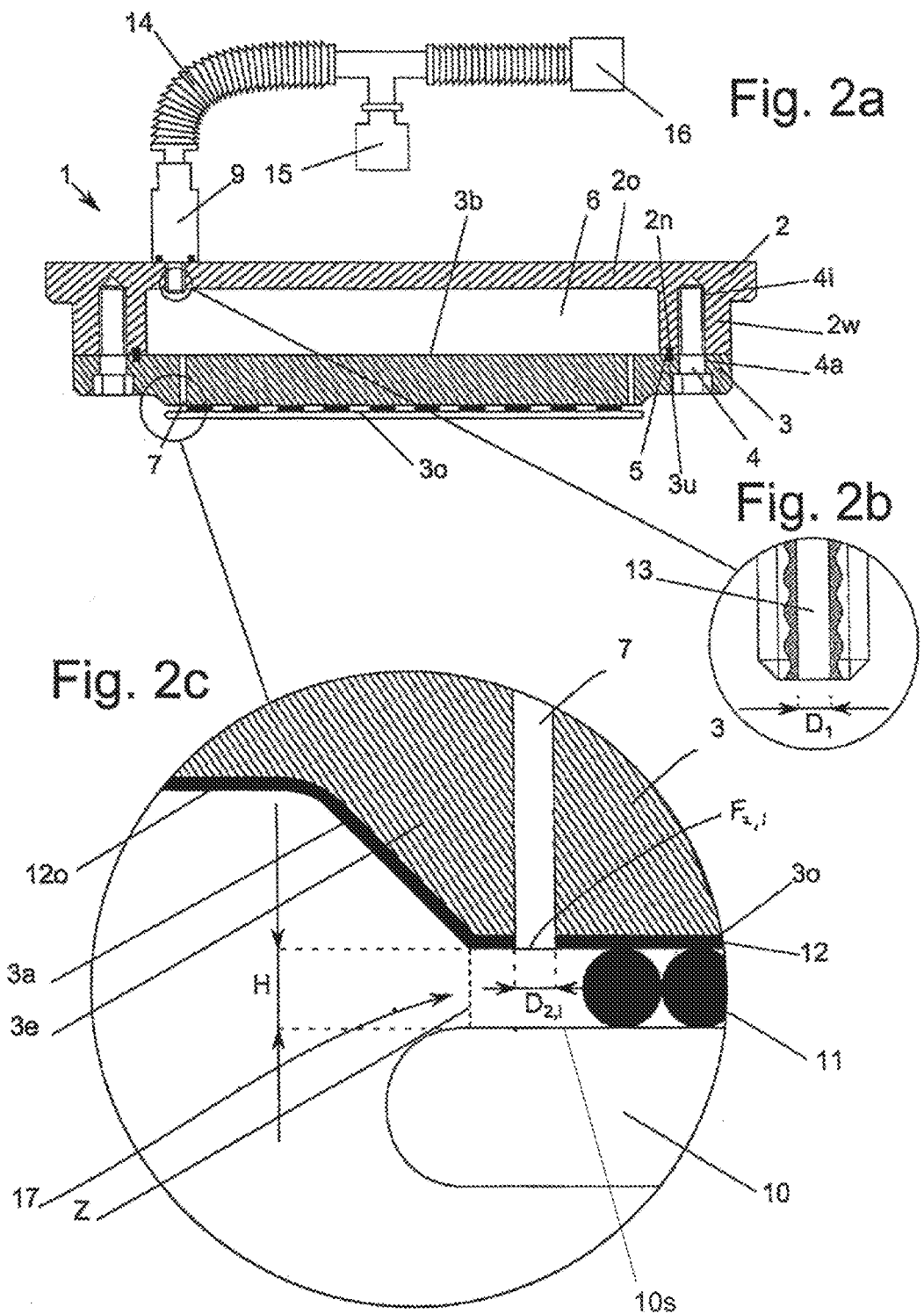

HOLDING DEVICE FOR HOLDING A PATTERNED WAFER

FIELD OF THE INVENTION

The invention relates to a mounting apparatus for mounting of a substrate, especially of a wafer, on a side of the substrate, which has structures thereon.

BACKGROUND OF THE INVENTION

Mounting apparatus are used as "chucks" in the semiconductor industry for handling of wafers in the production of electrical components in various process steps. Wafers, which are provided with individual component groups (structures), are typically referred to as product wafers. In each process step, it is important that the wafers are quickly, reliably and easily detachably fixed on the mounting apparatus so that handling of the wafers is not a disruption factor for the processing of the wafers. The fixing of product wafers, which have structures thereon, is more difficult the thinner they are and the more pronounced and higher is the topography of the components on the product wafers. Any stress in the wafer is to be avoided as much as possible so that the very expensive structures, which are present on the product wafer, are not damaged. While there are different approaches to fixing, i.e., mounting, a product wafer on the unstructured, flat side thereof, there are a host of technical problems in the fixing of a product wafer on its structured side. Thus, for example, electrostatic fixing is problematic since the electrical circuits of the structures can be destroyed by possible voltage peaks.

Furthermore, it is desirable to handle the electrical structures as free of contamination as possible and without impurity (for example by adhesive).

The object of this invention is therefore to provide a mounting apparatus for mounting and handling, as well as fixing of a substrate in which rapid, safe and careful, as well as reversible and easily controllable, mounting and fixing of the substrate are enabled.

This object is achieved with the features of Claim 1. Advantageous developments of the invention are given in the dependent claims. All combinations of at least two of the features given in the specification, the claims and/or the figures also fall within the framework of the invention. At the given value ranges values which lie within the indicated limits are also to be considered disclosed and claimed in any combination.

SUMMARY OF THE INVENTION

The invention is based on the concept of developing known vacuum chucks, such that structures of the substrate are incorporated at the same time into the fluid flow which suctions the substrates such that a uniform suction action (suction pressure) as homogeneous as possible over the entire structure side of the substrate is enabled. In other words, the mounting apparatus, as claimed in the invention enables a linearly variable, homogeneous surface force on the product wafer so that the substrate can be mounted on the vacuum sample holder (mounting apparatus) with the desired surface force. Preferably, the surface force acting on the substrate can be controlled by changing the suction pressure in a linear relationship. The surface force is defined by the suction area $F_2$.

In contrast to vacuum chucks from the prior art, according to the present invention there is no blanket pressure application along the substrate, but rather suction is applied only in the region of an outer ring surface of the mounting surface of the mounting apparatus. It has been ascertained that the configuration as claimed in the invention yields an extremely homogenous pressure distribution along the mounting surface of the mounting apparatus, especially also outside of the suction area.

According to one advantageous embodiment of the invention, it is provided that the outer ring surface, which is made especially as a circular ring, extends from one peripheral edge of the mounting surface in the direction toward a middle M of the mounting surface. The maximum or average ring width R of the outer ring surface is less than ½, especially ⅕, preferably less than 1/10, even more preferably less than 1/100, of a diameter $D_3$ of the mounting surface. The thinner the ring width R relative to the diameter $D_3$ (or the remaining mounting surface) and/or the farther the suction surface acting on the peripheral edge of the mounting surface or on the periphery of the substrate, the more homogeneous the pressure distribution along the (entire) mounting surface.

Hereinafter $F_i$ is the i-th surface which results from the surface parameters for a round surface $F_i$ especially from the circle diameter $D_i$. If there is a number of j=1 ... N bores, $F_i$ is the sum of the areas of the $F_{i,j}$ bores.

Advantageously, the fluid flow is formed by a flow channel which has the following sections:

in the mounting element a host of suction channels which are comprised of through holes and which end in the suction area $F_2$, a fluid chamber which is connected to the suction channels on their channel ends opposite the suction area $F_2$ and at least one pressure connection which is provided on the fluid chamber for connection of a controllable aspiration apparatus.

The fluid chamber 6 is used here especially as a buffer and at the same time as a distributor for uniform suction along the suction area $F_2$ so that advantageously only a single pressure connection and a single pump are required to operate the mounting apparatus.

To the extent the suction area $F_2$ is adjustable, by at least partially closing a part of the suction channels, the mounting apparatus can be used for different product substrates with different structures/dimensions (especially the height H of the structures is relevant). The suction channels can be closed, preferably individually, by triggerable valves on/in the suction channels. Alternatively, it is conceivable to provide a rotating disk with openings in the region of the suction channels (corresponding to the outer ring surface) on the end of the suction channels which is facing away from the suction area $F_2$. In this way the suction channels can be adjusted continuously from fully open to fully closed by rotating the rotary disk. In this way all suction channels can be continuously adjusted at the same time.

It is also advantageous if the fluid chamber is formed by a fluid chamber element which is sealed to the mounting element, and by the mounting element. Thus the fluid chamber can be easily produced, for example, by milling of a trough shape into the fluid chamber element. The trough shape encompasses encompasses a round cylinder-shaped recess a round cylinder-shaped recess with a diameter which is larger than the maximum distance between the suction channels on their ends facing the fluid chamber. The fluid chamber element is thus comprised of a ring-shaped peripheral wall and an upper wall which border the fluid chamber. The fluid chamber element is sealed to the mounting element by connecting elements, such as screws. The seal is preferably a circular ring-shaped seal with a diameter which is larger than the diameter of the fluid chamber on the periphery of the fluid chamber between the fluid chamber element and the mounting element.

In another advantageous embodiment of the invention, it is provided that the flow channel in the region of the fluid chamber has a flow cross section of at least the same size, which is especially at least 5 times, preferably 10 times, even more preferably at least 20 times larger than the suction area $F_2$ and/or of the flow cross section $F_1$ of the pressure connection. The fluid chamber is thus used at the same time as a buffer and collecting space for the fluid which is flowing in from the suction channels.

It is furthermore advantageously provided that the suction area $F_2$ is chosen, or can be adjusted, such that it corresponds essentially to an inflow surface Z of a ring gap which has been formed between the mounting surface and the substrate which is mounted on the mounting surface. The ring gap has a height H which is defined by the height of the structures of the substrate. The ring gap runs on the periphery of the mounting surface (or on the periphery of the substrate) and is in the shape of a circular cylinder, wherein the inflow surface Z can be at least roughly computed from the periphery of the substrate or of the mounting surface and the height H.

According to another advantageous embodiment, it is provided that the mounting surface is provided on a projection of the mounting element whose contour is chosen such that it corresponds essentially to the surface contour of the substrates which are to be processed, especially with a diameter $D_3$ of the mounting surface between 200 mm and 450 mm, preferable exactly 200 mm or 300 mm or 450 mm. This feature more sharply defines the inflow surface Z since it corresponds to the more or less common outer contour between the mounting surface and the substrate surface which has the contours.

To the extent the mounting surface, especially the projection, is coated with an elastic layer, the structures which are present on the substrate are on the one hand mounted carefully on the mounting surface and on the other contamination (for example with metal shavings) is avoided.

The suction is further homogenized by a first group of especially at least 10, preferably at least 50, even more preferably at least 100, suction channels on a common first circle on the outer ring surface, the suction channels lying especially equidistantly to one another. This is because a uniform fluid flow, especially between the mounting surface and the substrate as far as to the middle M of the mounting surface, is effected by a concentric arrangement of the suction channels to the middle M of the suction surface or rotationally symmetrically to the mounting element.

According to another aspect of this invention the distance between the suction channels is smaller than 1 mm, especially smaller than 500 μm, preferably smaller than 250 μm, even more preferably smaller than 150 μm.

It is especially advantageous if there is a second group of at least 10, preferably at least 20 suction channels, offset to the suction channels of the first group, on a common second circle with a smaller radius than the first circle on the outer ring surface, concentrically to the middle M and/or equidistantly to one another. In this way, on the outer ring surface more suction channels can be accommodated. The more suction channels there are, the smaller they can be made and the more uniformly and more carefully suction of the substrate takes place. At the same time, arranging at least two groups on the outer ring surface yields higher stability of the mounting element. The number of suction channels is consequently limited upward only by the minimum diameter of the suction channels and the dimensions of the mounting element. The offset bores are thus a replacement for a slot which would act disadvantageously on the mechanical stability of the wafer on the edge.

According to another aspect of this invention the inflow surface Z is conceivable by changing, especially controlling, the diameter $D_{2i}$ of each suction channel.

To the extent method features have been disclosed, they are to be considered and claimed as disclosed as the method as claimed in the invention.

Other advantages, features and details of the invention will become apparent from the following description of preferred exemplary embodiments and using the drawings.

BRIEF DESCRIPTION OF THE DRAWINGS

FIG. 2b shows a detailed view from FIG. 2a and FIG. 2c shows a detailed view from FIG. 2a.

DETAILED DESCRIPTION OF PREFERRED EMBODIMENTS

The same components or components with the same action are identified with the same reference numbers in the figures.

Figure 1A:
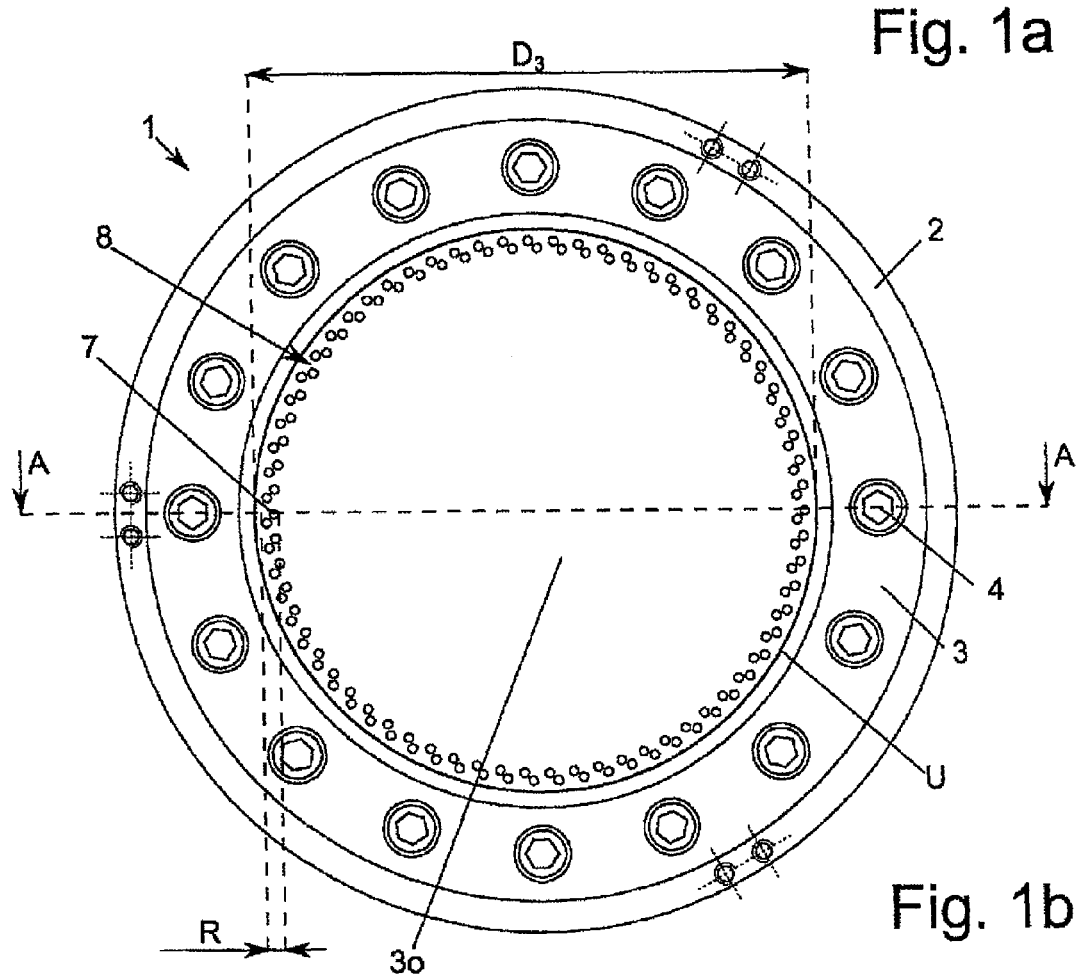
FIG. 1a shows a plan view of a mounting apparatus as claimed in the invention from underneath with a cutting line A-A.
Figure 1B:
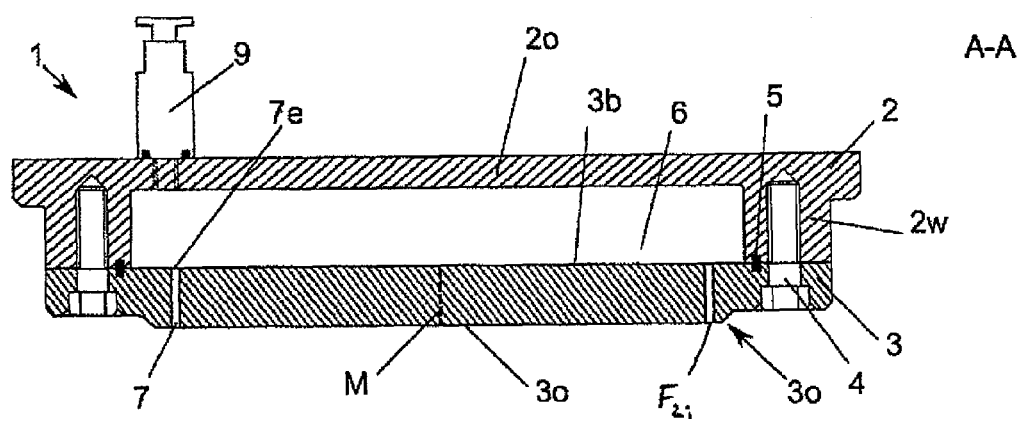
FIG. 1b shows a cross sectional view according to cutting line A-A from FIG. 1a, FIG. 2a shows a view according to FIG. 1b with a structured substrate which is mounted on the mounting apparatus.
Figure 3:
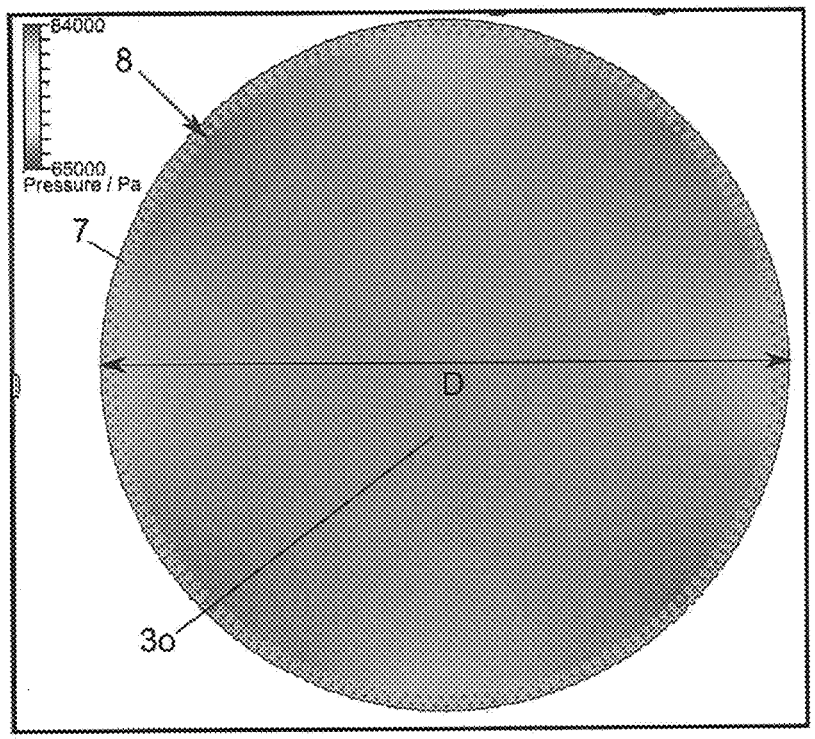
FIG. 3 shows a contour plot view of the pressure distribution of the surface 3o, computed with a fluid simulation program
Figure 4:
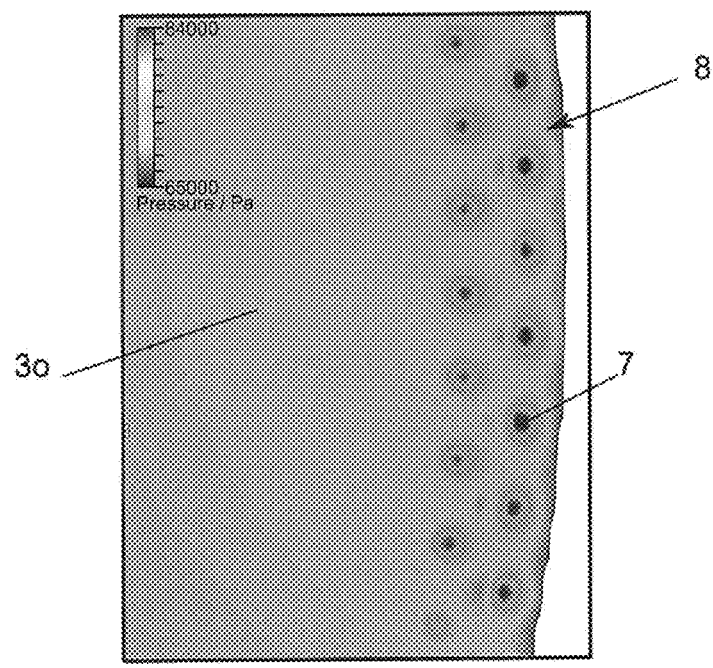
FIG. 4 shows an enlargement of the contour plot view of the pressure distribution of the surface 3o, computed with a fluid simulation program.

FIG. 1a shows a mounting apparatus 1 which consists of a fluid chamber element 2 and a mounting element 3. The fluid chamber element 2 consists of a ring-shaped peripheral wall 2w which is formed by out-milling a circular cylinder and an upper wall 2o which covers the ring-shaped peripheral wall 2w. The upper wall 2o also forms the bottom of the milled-out cylinder. To facilitate fixing of the mounting element 3 on the fluid chamber element 2, in the production of the fluid chamber element 2 internal threads 4i are cut into the peripheral wall 2w. The internal threads 4i are distributed on the periphery of the peripheral wall 2w equidistantly to one another. In the production of the fluid chamber element 2, at least one seal groove 2n is provided on the connecting surface between the fluid chamber element 2 and the mounting element 3. In the production of the fluid chamber element 2, a pressure connection 13 is provided in the upper wall 2o. A connection element 9 is sealed (or can be sealed) to the pressure connection 13. The connection element is used to connect an intake pipe 14 which is connected to a pump 16. In the intake pipe 14 there can be one or more measurement apparatus 15 for pressure measurement. The pressure can also be measured in the pump 16 and/or at another position in the flow channel.

The pressure connection 13 has a flow cross section $F_1$, defined by a bore with a diameter $D_1$. The pressure connection 13 is part of a flow channel which runs through the mounting apparatus 1. The pressure connection 13 (and thus the flow channel) leads to a fluid chamber 6 which is formed by the upper wall 2o and the peripheral wall 2w and an attachment side 3b of the mounting element 3.

The mounting element 3 has essentially a cylinder shape with an outer periphery which corresponds to the fluid chamber element 2, especially to the peripheral wall 2w so that the mounting element 3 can be sealed with its especially planar attachment side 3b on one contact surface to the fluid chamber element 2. For this purpose there are screw receivers 4a which are arranged corresponding to the internal threads 4i for accommodating connecting elements 4 which are made as screws. The mounting element 3 can be fixed by the connecting elements 4 on the fluid chamber element 2 on their common contact surface, a seal 5 being made as a ring seal in the seal groove 2n and optionally a corresponding seal groove 3n of the mounting element 4 for sealing the fluid chamber 6 relative to the environment.

The fluid chamber 6 forms another section of the flow channel. Proceeding from the fluid chamber 6, the flow channel is divided or branched in another section of the flow channel which is formed by a plurality of suction channels 7 which are provided in the mounting element 3.

The suction channels 7 are made as through bores which run especially parallel to one another and whose ends 7e all communicate with the fluid chamber 6. The opposite ends of the suction channels 7 terminate in the region of one outer ring surface 8 of a mounting surface 3o for mounting of a substrate 10. The mounting surface 3o is provided on a projection 3e which is made as a circular ring with a diameter $D_3$ and an obliquely running shoulder 3a. The diameter $D_3$ corresponds essentially to the diameter of the substrate 10.

A first group of suction channels 7 is located on a circle and within the outer ring surface 8, while a second group of suction channels 7 is located on a second circle which is located farther inside and likewise within the outer ring surface 8. Thus, as many suction channels 7 as possible with a diameter $D_2$ as small as possible are accommodated as near as possible to one peripheral edge U of the mounting surface 3o. Due to the thickness of the mounting element 3 a support section of the mounting surface 3o provided within the outer ring surface 8 remains stable. In the support section there are no suction channels 7 and the support section and the entire mounting surface 3o are made flat.

The surface of the mounting element 3 can be at least partially coated with a coating 12 of soft material especially in the region of the mounting surface 3o. Preferably it is a polymer, preferably an elastomer. The coating 12 is used to protect sensitive structures 11 provided on the substrate 10 and to prevent contamination of the substrate 10 which is made as a product substrate.

The suction channels 7, which are produced by drilling, are arranged concentrically relative to a middle M of the rotationally symmetrical mounting element 3.

A ring width R of the outer ring surface 8 is made as small as possible and is located as far as possible on the peripheral edge U. Ring width R is between 1 mm and 50 mm, preferably between 1 mm and 10 mm. The diameter $D_3$ is between 200 mm and 450 mm, preferably exactly 200 mm, 300 mm or 450 mm.

By continuously exposing the fluid chamber 6 to a negative pressure via the pressure connection 13 and the pump 16, a suction action arises on a suction area $F_2$ which is formed by the sum of the flow cross sections of the suction channels 7 on the mounting surface 3o. In this way the substrate 10 with its structure side 10s can be sucked onto the mounting surface 3o and fixed. Although there are suction channels 7 only on the outer ring surface 8 (circular ring), the area is also evacuated or negatively pressurized which is penetrated by structures 11, which lies within the outer ring surface 8 and between the mounting surface 3o and the substrate 10, and which is surprisingly homogeneous. The homogeneous pressure distribution is most easily explained by the statistical multiparticle system in this region being understood as a large canonical ensemble. An ensemble is a set of replicas of a statistical multiparticle system which differ in their microstates but have equivalent macrostates. A large canonical ensemble is an ensemble which is subject to fluctuations of particles and energy. Although the embodiment as claimed in the invention continuously sucks particles on the edge, some particles always find the path into the interior region, likewise particles will also leave this region again. Therefore an absolute vacuum or even only a high vacuum will never be attainable. Still the number of particles can on average be kept constant with constant starts and boundary conditions. Since there are no potentials which make the statistical distribution function locally dependent (aside from gravitation potential whose effects on the distribution function are negligible for the short height of the examined region) the pressure distribution must likewise be a homogeneous function of the site. Thus the substrate 10 with the structures 11 is fixed very uniformly on the mounting surface 3o. The force acting on the substrate 10 is defined by controlling the negative pressure on the pump 16 and by means of the flow cross sections of the individual sections of the flow channel.

According to the present invention, it has been found to be optimum if the cross sectional area $F_1$ of the pressure connection 13 corresponds roughly to the sum of the cross sectional areas of the suction channels 7, therefore roughly the suction area $F_2$. The ratio of the areas $F_1$ to $F_2$ is especially between 1 to 10 and 10 to 1, preferably between 2 to 7 and 7 to 2, more preferably between 3 to 5 and 5 to 3, most preferably between 4 to 5 and 5 to 4.

The suction area $F_2$ is moreover advantageously chosen such that it corresponds roughly to an inflow surface Z which is formed by a ring gap 17 between the peripheral edge U of the mounting surface 3o and the substrate 10 due to the height of the structures 11 during suction. The inflow surface Z corresponds to the periphery of the ring gap 17 multiplied by the height H of the ring gap 17, a ratio of the suction area $F_2$ to the inflow surface Z being between 4 to 5 and 5 to 4.

As long as the substrate 10 is to be held on the mounting apparatus 1, the pump 16 must provide for a continuous fluid flow along the flow channel. It is provided by the above described flow cross section of the flow channel as claimed in the invention that the amount of gas which flows through the suction channels 7 per unit of time is equal to the amount of gas which leaves the fluid chamber 6 through the pressure connection 13 or the connection element 9.

The topographical structures 11 keep the substrate 10 (wafer) separated at a distance H (corresponds to height H of the ring gap 17) from the projection 3e, specifically the mounting surface 3o. The space between the substrate and the mounting surface 3o at the start of the suction process is automatically lowered to a certain pressure level somewhat above the suction pressure on the suction area $F_2$ and subsequently remains constant for further continuous pressurization of the fluid chamber 6. At this instant there is an especially steady-state pressure distribution along the flow profile from the inflow surface Z to the pump 16.

Thus, as claimed in the invention, how large the surface force acting on the substrate 10 on the mounting surface 3o is can be controlled by the suction performance, especially the volumetric flow or any other easily accessible and measurable physical quantity, of the pump 16, by changing the suction performance, a preferably linear change of the surface force taking place. According to another embodiment of the invention it is provided that the elastic coating 12 is elastic such that the structures 11 penetrate at least partially, especially at least by one third of the height H, preferably by half of the height H, even more preferably by three fourths of the height H, into the elastic coating 12. In this way the height H' of the ring gap 17 is reduced so that the inflow surface Z' becomes correspondingly smaller. This could result in a reinforcing effect. A smaller inflow surface Z' at the same volumetric flow would mean a higher force and thus would press the wafer farther into the coating 12; this in turn would result in a reduction of the inflow surface Z'.

According to another advantageous embodiment of the invention, especially in combination with the embodiment described in the preceding paragraph, it is conceivable as claimed in the invention to make the suction channels 7 at least partially sealable. In this way there would be a dynamic matching possibility for the inflow surface Z'.

REFERENCE NUMBER LIST 1 mounting apparatus
2 fluid chamber element
2w peripheral wall
2o upper wall
2n seal groove
3 mounting element
3o mounting surface
3e projection
3b attachment side
3n seal groove
4 connecting elements
4i internal thread
4a screw receiver
5 seal
6 fluid chamber
7 suction channel
7e ends
8 outer ring surface
9 connection element
10 substrate
10s structure side
11 structures
12 coating
13 pressure connection
14 intake pipe
15 measurement apparatus
16 pump
17 ring gap
$F_1$ flow cross section
$F_2$ suction surface
U peripheral wall
M middle
R ring width
$D_1$ diameter
$D_2$ diameter
$D_3$ diameter
Z inflow surface
H height

The invention claimed is:

1. A mounting apparatus for mounting and holding one structure side of a substrate, the one structure side having structures thereon and the structures having an upper surface that is displaced from the structure side of the substrate such that a structure gap is formed between the upper surface of the structures and the structure side of the substrate, said mounting apparatus comprised of:
   a mounting element having a substantially circular mounting surface,
   the mounting surface having suction channels that are formed through the mounting surface and located on an outer ring surface of the mounting surface,
   the mounting surface being formed as a planar flat mounting surface for supporting the structures on said one structure side,
   the suction channels opening at suction holes such that when the substrate is mounted and held by the mounting apparatus the structures are in contact with the mounting surface and the suction holes are located at least partially radially outward from the structures relative to a rotational center of the mounting surface,
   the suction holes being displaced from the structure side of the substrate such that a ring gap is formed between the structure side of the substrate and the suction holes, and
   the ring gap being formed such that a continuous fluid flow through the ring gap and the suction channels is maintained while the substrate is being held by the mounting apparatus.

2. The mounting apparatus as claimed in claim 1, wherein the outer ring surface is made as an annular ring that extends from one peripheral edge of the mounting surface toward the rotational center of the mounting surface, said outer ring surface having a ring width that is less than ½ of a diameter of the mounting surface.

3. The mounting apparatus as claimed in claim 1, wherein the continuous fluid flow passes through a flow channel which has the following sections:
   in the mounting element, the suction channels are made as through openings, each of said through openings having a first end at which the suction holes are formed,
   a fluid chamber which communicates with the suction channels at respective second ends of said through openings, the second ends being located at respective opposite ends of said through openings from the first ends, and
   a pressure connection which communicates with the fluid chamber, said pressure connection being configured to connect to a pump.

4. The mounting apparatus as claimed in claim 3, wherein the suction holes form a suction area, the suction area being adjustable by at least partially closing a part of the suction channels.

5. The mounting apparatus as claimed in claim 3, wherein the fluid chamber is formed between a fluid chamber element and the mounting element.

6. The mounting apparatus as claimed in claim 3, wherein the flow channel in a region of the fluid chamber has a flow cross section which is at least 5 times larger than the suction area of a flow cross section of the pressure connection.

7. The mounting apparatus as claimed in claim 3, wherein a first group of at least 10 of the suction channels are located on a common first circle of the outer ring surface such that the first group of suction channels are spaced equidistantly apart relative to adjacent suction channels.

8. The mounting apparatus as claimed in claim 7, wherein a second group of at least 10 suction channels are located offset relative to the first group of suction channels, wherein the second group of suction channels are located on a common second circle of the outer ring surface, the common second circle having a smaller radius than the common first circle.

9. The mounting apparatus as claimed in claim 1, wherein the mounting surface is provided on a projection of the mounting element, the mounting surface having a contour corresponding with a surface contour of the substrate, a diameter of the mounting surface being between 200 mm and 450 mm.

10. The mounting apparatus as claimed in claim 1, wherein the mounting surface is coated with an elastic coating.

11. A method for mounting and holding one structure side of a substrate using a mounting apparatus, the one structure side having structures thereon and the structures having an upper surface that is displaced from the structure side of the substrate such that a structure gap is formed between the upper surface of the structures and the structure side of the substrate, said method comprised of:

effecting a continuous and controllable flow through suction channels of the mounting apparatus, mounting and holding the substrate to the mounting apparatus using the continuous and controllable flow through the suction channels of the mounting apparatus, the mounting apparatus having a mounting element having a substantially circular mounting surface, the suction channels being formed through the mounting surface and located on an outer ring surface of the mounting surface, the mounting surface being formed as a planar flat mounting surface for supporting the structures on said one structure side, the suction channels opening at suction holes such that when the substrate is mounted and held by the mounting apparatus the structures are in contact with the mounting surface and the suction holes are located at least partially radially outward from the structures relative to a rotational center of the mounting surface, the suction holes being displaced from the structure side of the substrate such that a ring gap is formed between the structure side of the substrate and the suction holes, and the continuous and controllable flow passing through the ring gap and the suction channels such that the continuous and controllable flow is maintained while the substrate is being held by the mounting apparatus.

\* \* \* \* \*